… …

United States Patent [19]

Satou

[11] Patent Number: 4,624,358
[45] Date of Patent: Nov. 25, 1986

[54] DEVICE FOR TRANSFERRING LEAD FRAME

[75] Inventor: Takeo Satou, Yokohama, Japan

[73] Assignee: Tokyo Shibaura Denki Kabushiki Kaisha, Kawasaki, Japan

[21] Appl. No.: 586,696

[22] Filed: Mar. 6, 1984

[30] Foreign Application Priority Data

Mar. 7, 1983 [JP] Japan .................................. 58-37163
Mar. 7, 1983 [JP] Japan .................................. 58-37164

[51] Int. Cl.$^4$ .......................................... B65G 25/04
[52] U.S. Cl. ................................... 198/345; 198/621; 198/468.1; 29/759; 29/827
[58] Field of Search ............ 198/345, 735, 621, 468.1; 29/759, 827; 226/67, 141; 228/4.5

[56] References Cited

U.S. PATENT DOCUMENTS

| 3,726,458 | 4/1973 | Rabl ...................... 226/141 |
| 4,202,092 | 5/1980 | Shibasaki et al. ........... 29/759 X |
| 4,516,673 | 5/1985 | Kashihara et al. ........... 198/345 X |
| 4,524,860 | 6/1985 | Misawa et al. ............. 198/740 |
| 4,540,084 | 9/1985 | Curti .................... 198/621 X |

FOREIGN PATENT DOCUMENTS 54-151272 11/1979 Japan .................................. 198/345
56-23113 4/1981 Japan .................................. 198/345
58-157620 9/1983 Japan .

OTHER PUBLICATIONS

Japanese-language products catalogue (pp. 16 and 22).

Primary Examiner—Joseph E. Valenza
Assistant Examiner—Michael Stone
Attorney, Agent, or Firm—Schwartz, Jeffery, Schwaab, Mack, Blumenthal & Evans

[57] ABSTRACT

In the case of the fabrication of semiconductor devices, lead frames are successively transferred to the bonding position where semiconductor chips are bonded to a lead frame. To this end, a lead frame transfer device has been used. According to the present invention, there are provided means for adjusting the distance between a pair of guide rails which define the lead frame transfer passage and means for varying the transfer stroke or pitch of a device for transferring a lead frame along the guide rails. The means for adjusting the distance between the pair of guide rails comprises gage holes and gages or lead screws and nut so that one of the pair of guide rails is moved toward or away from the other guide rail depending upon the width of a lead frame to be transferred. The means for varying the transfer stroke or pitch of a device for transferring a lead frame comprises cams and sensors, and varies them through rotating a screw shaft combined with a nut by a motor.

7 Claims, 13 Drawing Figures

FIG. I
PRIOR ART
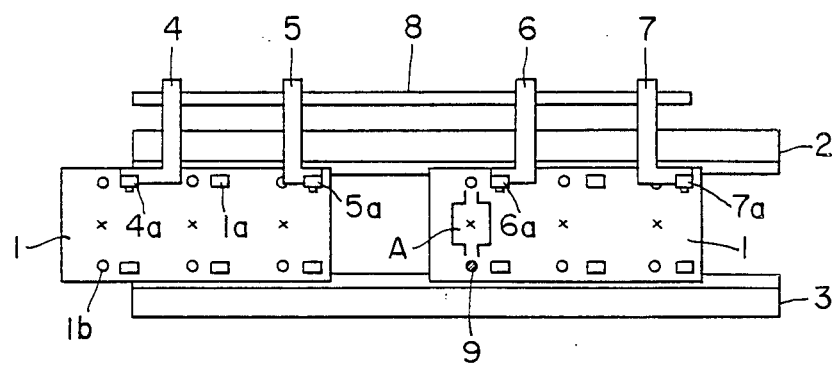
FIG. 2
PRIOR ART
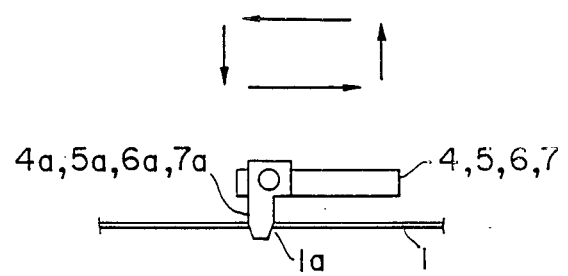

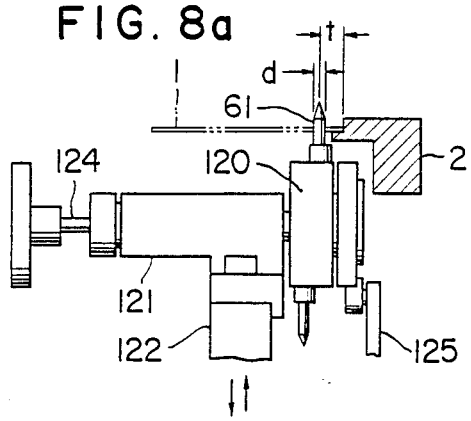
FIG. 8a
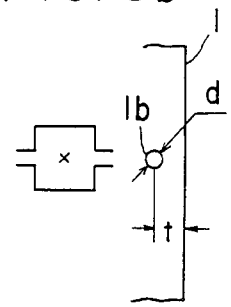
FIG. 8b
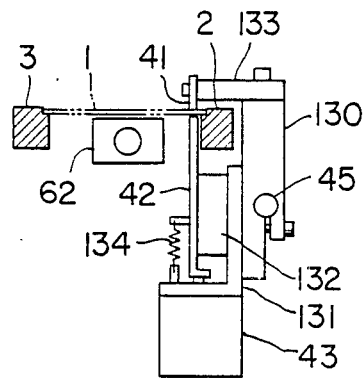
FIG. 9
FIG. 10
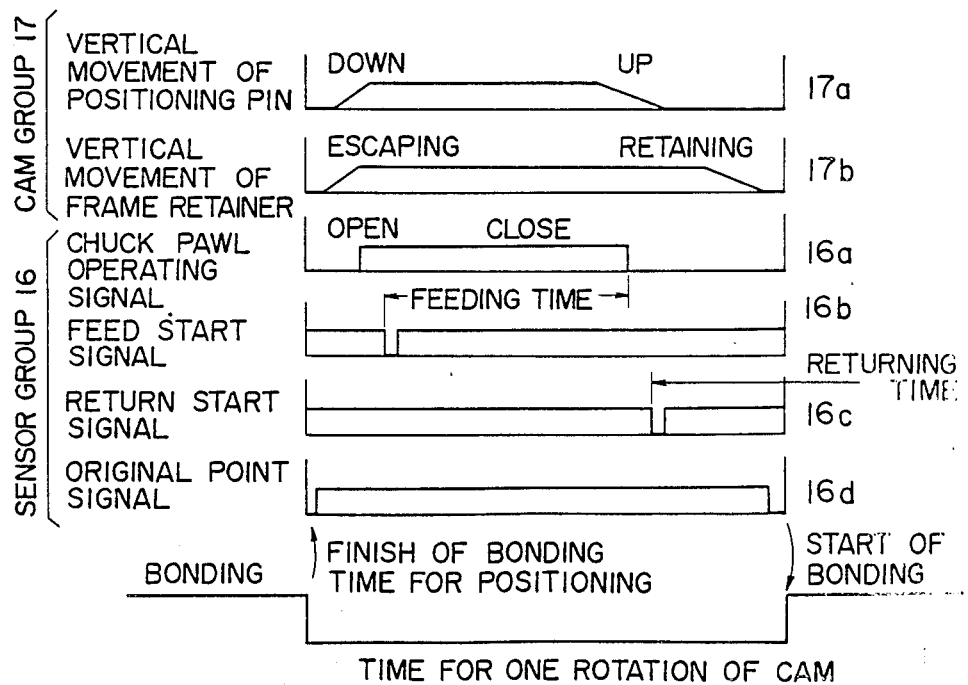

DEVICE FOR TRANSFERRING LEAD FRAME

BACKGROUND OF THE INVENTION

The present invention relates to a device used for the fabrication of semiconductor devices and more particularly to a device for transferring and positioning a lead frame when a semiconductor chip is mounted.

In the case of mounting semiconductor chips, there have been used devices for transferring a lead frame with continuously formed leads corresponding to the semiconductor chips a predetermined pitch or distance and positioning it at a predetermined position where die bonding or wire bonding is effected.

Since the semiconductor chips vary in size, lead frames of various sizes must be used.

However, when a device for transferring lead frames is readjusted so that it can handle lead frames of a different size, it takes a long time and it is cumbersome to modify it.

SUMMARY OF THE INVENTION

One of the objects of the present invention is to provide a lead frame transfer device which can be quickly readjusted for handling lead frames of various sizes with a high degree of accuracy so that the operation efficiency and the yield can be improved.

Another object of the present invention is to provide a lead frame transfer device which can adjust a transfer pitch depending upon the length of each lead frame.

A further object of the present invention is to provide a lead frame transfer device in which in response to the width of a lead frame to be transferred, the width of a pair of rails for guiding the lead frame can be adjusted.

BRIEF DESCRIPTION OF THE DRAWINGS

FIG. 1 is a top view of a conventional lead frame transfer device;

FIG. 2 is a view used to explain the construction and mode of operation of a transfer pawl of the lead frame transfer device as shown in FIG. 1;

FIGS. 8a and 8b are views used to explain positioning means shown in FIGS. 3 and 7;

FIG. 9 is a view used to explain a chuck mechanism used in the present invention;

FIG. 10 is a diagram used to explain the mode of operation of cams and sensors which control a lead frame transfer device in accordance with the present invention;

DETAILED DESCRIPTION OF THE PREFERRED EMBODIMENTS

Figure 3:
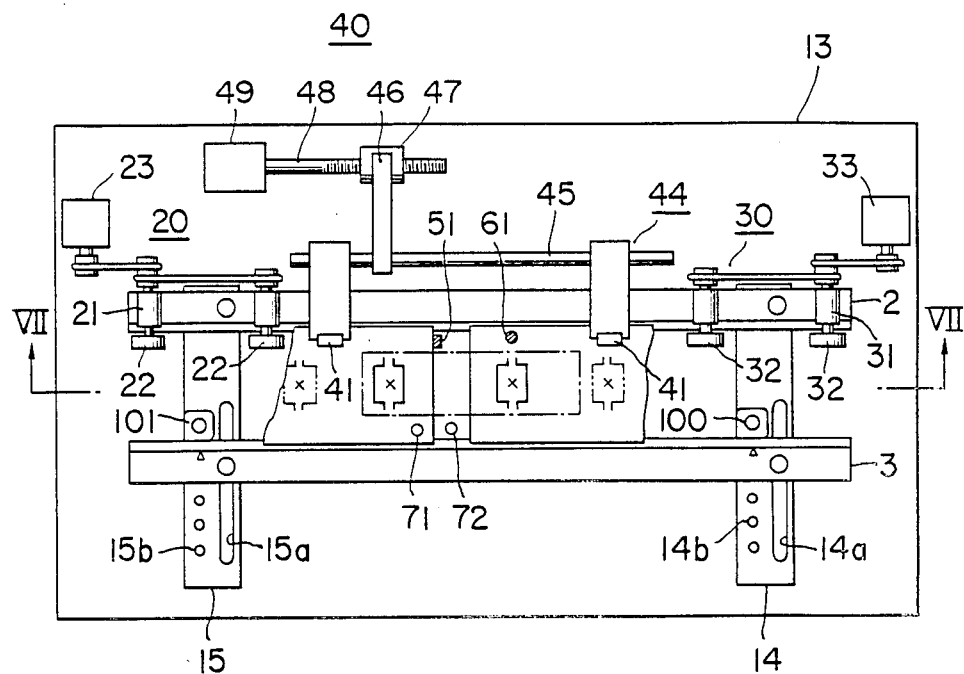
FIG. 3 is a top view of a first embodiment of the present invention.

The Prior Art, FIGS. 1 and 2

Prior to the description of the preferred embodiments of the present invention, a conventional lead frame transfer device will be briefly described so that the problems encountered in the conventional lead frame transfer devices become more apparent.

As shown in FIG. 1, a conventional lead frame transfer device includes a pair of parallel guide rails 2 and 3 which support the side edges of a lead frame 1 and guide the lead frame 1 in its longitudinal direction. The lead frame 1 is therefore transported to a position A where die bonding or wire bonding is effected (to be referred to as "the bonding position A" hereinafter in this specification). A shaft or rod 8 is disposed in parallel with the guide rails 2 and 3 and a plurality of transfer arms 4, 5, 6 and 7 are mounted on the rod 8 so as to transfer the lead frame 1 to the bonding position A. The transfer arms 4–7 are driven by a transfer mechanism including cams and cranks (not shown). Disposed adjacent to the bonding position is a positioning means (not shown) which is adapted to cause a positioning pin 9 to reciprocate in the direction vertical to the flat surface of the lead frame 1.

The lead frame 1 is provided with grooves and holes of various sizes. For instance, when the lead frame 1 is transferred, rectangular holes 1a formed along one side edge of the lead frame 1 are used and when the lead frame 1 is located at the bonding position A, round holes 1b formed along the other side edge of the lead frame 1 are used.

As shown in FIG. 2, each of the transfer arms 4–7 carries a transfer pawl 4a, 5b, 6a or 7a which is adapted to engage with the rectangular holes 1a of the lead frame 1. The positioning pin 9 is extended from the positioning means (not shown) for engagement with the round hole 1b.

In the conventional lead frame transfer device of the type described, the bonding position A remains unchanged and the lead frames 1 are sequentially stopped at the bonding position A. In the case of lead frames of a different width, the guide rails 2 and 3 are moved toward or away from each other. In the case of lead frames of a different length, the positions of the transfer arms 4 to 7, the distance between them and the stroke must be adjusted. In the case of lead frames with different holes, the transfer pawls 4a–7a and the positioning pin 9 must be replaced with suitable ones.

When the size of the lead frames varies, the width, the pitch and the shapes of holes also vary. Therefore it follows that it takes a long time to adjust the lead frame transfer device in the manner described above so that the operation efficiency drops. Furthermore, maladjustments are found only after a trial operation has been carried out. As a result the yield is considerably low.

The Invention, FIGS. 3–12

Figure 7:
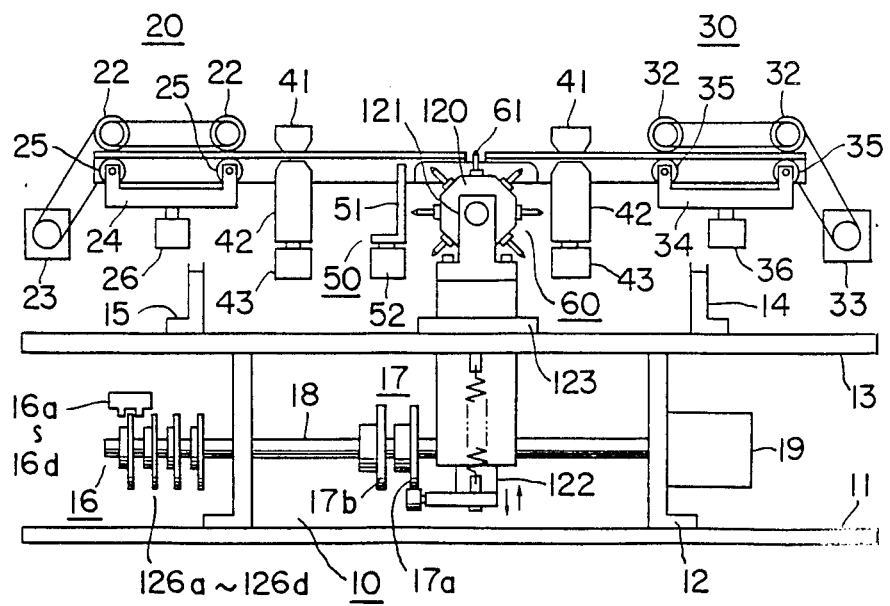
FIG. 7 is a front view taken along the line VII—VII of FIG. 3.

FIG. 3 is a top view of a lead frame transfer device in accordance with the present invention and FIG. 7 is a front view thereof. The lead frame transfer device comprises in general a stand 10 upon which are mounted guide rails 2 and 3 and driving mechanisms to be described below; a lead frame feed device 20 for feeding lead frames along the guide rails 2 and 3; a discharge device 30 for discharging the lead frame after the bonding step to the succeeding working station; an intermittent transfer device 40 adapted to sequentially transfer the lead frame fed by the lead frame feed device 20 at a predetermined stroke; a stopping device 50 adapted to engage with the leading edge of a lead frame so as to locate or position it at a predetermined position; and a turret type positioning device 60 for positioning a lead frame in the case of the bonding step.

Figure 4:
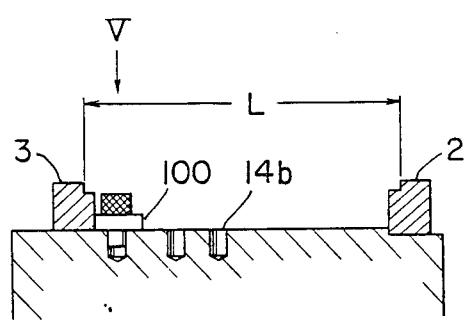
FIG. 4 is a view used to explain the adjustment of the width between a pair of guide rails thereof.
Figure 5:
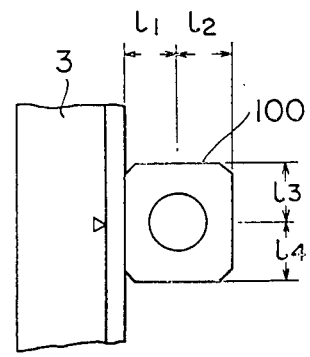
FIG. 5 is a top view looking into the direction indicated by an arrow V in FIG. 4.

The stand 10 has an intermediate base plate 13 which is supported by supporting plates 12 on a main base plate 11 and supporting members 14 and 15 are mounted on the intermediate base plate 13 and spaced apart from each other by a predetermined distance. Guide rails 2 and 3 are mounted on the supporting members 14 and 15. The rail mounting surfaces of the supporting members 14 and 15 are formed with grooves 14a and 15a and gage holes 14b and 15b. Rails-width-adjusting gages 100 and 101 are adapted to engage with the gage holes 14b and 15b as shown in FIG. 4. FIG. 5 is a top view of the gage 100. Each of the gages 100 and 101 has four peripheral surfaces with different lengths $l_1$, $l_2$, $l_3$ and $l_4$ (See FIG. 5) so that even when the same gage hole 14b or 15b is used the width between the guide rails 2 and 3 can be varied in four steps. Therefore the width between the guide rails 2 and 3 can be varied in response to the width L of a lead frame.

Figure 6:
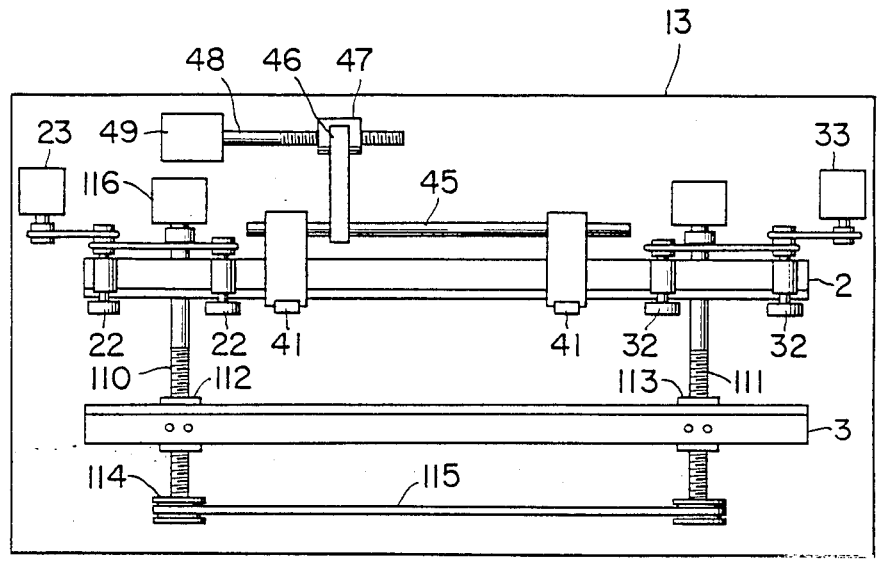
FIG. 6 is a top view of another device for adjusting the width between a pair of guide rails.

FIG. 6 shows a mechanism for adjusting the width between the guide rails 2 and 3. The guide rail 3 is supported by nuts 112 and 113 which in turn threadably engage with lead screws 110 and 111, respectively. The lead screw 110 is driven by an electric motor 116 and the lead screw 111 is drivingly coupled with the lead screw 110 by means of a belt 115 so that the lead screw 111 is driven in unison with the lead screw 110. When the motor 116 is driven in one direction, the width between the guide rails 2 and 3 is increased, but when the motor 116 is driven in the other direction, the distance between the guide rails 2 and 3 is reduced.

The lead frame feed device 20 has rollers 22 which are supported by one end of housing 21 and which are drivingly coupled with an electric motor 23 by means of belts. The lead frame feed device 20 further includes rollers 25 attached to the ends of a U-shaped roller supporting member 24. The side edge of the lead frame 1 is sandwiched between the rollers 22 and 25. The U-shaped roller supporting member 24 is connected to a cylinder 26 so that the rollers 25 can be moved toward or away from the rollers 22.

The lead frame discharge device 30 is substantially similar in construction to the lead frame feed device 20. It also comprises a main roll mechanism and a follower roll mechanism. The main roll mechanism includes rollers 32 attached to one ends of housing 31 and drivingly coupled to an electric motor 33 by means of belts. The follower roll mechanism includes rollers 35 attached to the ends of a U-shaped roller supporting member 34 which in turn is connected to an air cylinder 36. Therefore the side edge of the lead frame is sandwiched between the rollers 32 and the rollers 35 and the rollers 35 are moved toward or away from the rollers 32 by the air cylinder 36.

The intermittent feed device 40 comprises a pair of chuck mechanisms 44 which are mounted on a slide rod 45, which is disposed in parallel with the guide rail 2, and which are spaced apart from each other by a suitable distance in the longitudinal or axial direction of the slide rod 45. Each chuck mechanism 44 comprises a stationary pawl 41 and a movable pawl 42 which is connected to an air cylinder 43 so that the movable pawl 42 can be moved toward or away from the stationary pawl 41. The side edge of the lead frame 1 is sandwiched between the stationary and movable pawls 41 and 42. The slide rod 45 is connected to one end of an arm 46 the other end of which is connected to a nut 47 threadably engaged with a lead screw 48 connected to the drive shaft of an electric motor 49. Therefore, when the electric motor 49 is driven, the chuck mechanisms 44 are caused to move along the guide rail 2.

As shown in FIG. 9, the stationary and movable pawls 41 and 42 are mounted on a holder 130 which in turn is mounted on the slide rod 45. The stationary pawl 41 is mounted on the holder 130 through an arm 133 and the movable pawl 42 is caused to move toward or away from the stationary pawl 41 by means of the air cylinder 43 along a slider 132 against the force of a spring 134. The air cylinder 43 is mounted on a supporting member 131 which in turn is attached to the holder 130. When the movable pawl 42 is caused to move upwardly, the lead frame 1 is clamped between the stationary and movable pawls 41 and 42.

The stopping device 50 is disposed on the side of the guide rail 2 and at the midpoint thereof and comprises a stopper 51 which is adapted to engage the leading edge of the lead frame 1 and an air cylinder 52 for retracting the stopper 51 when the lead frame 1 is transferred to the bonding position.

The positioning device 60 comprises, as shown in FIG. 7, a plurality of positioning pins 61 which are disposed like a turret. Depending upon the diameter d of a hole of the lead frame 1 and the distance t from the side edge of the lead frame 1 to the center of the hole (see FIGS. 8a and 8b), one of the pins 61 is selected as a holder 120 is rotated. As a cam 17a rotates, the holder 120 is controlled through a shaft 124, a housing 121 and a sliding member 122 and is adapted to move vertically. A locking mechanism 125 is provided in order to lock the angular position of the holder 120. An electric motor (not shown) and a control circuit (not shown) are provided so that in response to an external instruction or command, the angular position of the holder 120 is selected and the holder 120 can be locked at the selected angular position.

Disposed adjacent to the stopping device 50 are a sensor 71 for detecting the leading edge of the lead frame 1 and a sensor 72 for detecting that the trailing edge of the lead frame 1, which is transferred or transported at a predetermined pitch, has passed the sensor 72.

The electric motors and air cylinders for the above-described intermittent feed device, the stopping device 50 and the positioning device 60 are all disposed on the side of the guide rail 2.

A shaft 18 is rotatably extended through the supporting members 12 between the base plate 11 and the intermediate base plate 13 in parallel with the guide rails 2 and 3. A sensor group 16 is mounted on the shaft 18 on the side of the lead frame feed device 20 and a cam group 17 is mounted on the shaft 18 at the midpoint thereof. The shaft 18 is connected to an electric motor 19 on the side of the lead frame discharge device 30. The cam group 17 is provided so that the positioning device 60 can be actuated through a linkage (122 etc.).

The modes of operation of the sensor groups 16a, 16b, 16c and 16d and the cam group 17a and 17b will be described with reference to FIG. 10. The cam group 17 has a cam 17a adapted to cause the vertical movement of a positioning pin and a cam 17b adapted to cause the vertical movement of a frame clamp (not shown). When the bonding step is finished, the positioning pin 61 is lowered and the frame clamp is withdrawn and prior to the bonding step, the positioning pin 61 is raised and the frame clamp is extended.

The sensor group 16 comprises a sensor 16a for generating the signal representing whether the chuck pawls are opened or not, a sensor 16b for generating the feed start signal, a sensor 16c for generating the return start signal and a sensor 16d for generating the original point signal.

When the bonding step has been finished, the motor 19 is rotated so that the positioning pin 61 and the frame clamp (not shown) are withdrawn. In response to the signal from the sensor 16a, the cylinder 43 is actuated and in response to the signal from the sensor 16b, the motor 49 of the intermittent feed device 40 is driven so that the lead screw 48 is rotated and consequently the lead frame 1 is chucked and transported.

After the lead frame has been transferred, the sensor 16a is turned off so that the movable pawl 42 is moved away from the stationary pawl 41. The cam group 17 causes the positioning pin 61 and the frame retainer to be extended so that the lead frame can be brought to and held at the predetermined position. Simultaneously, in response to the signal from the sensor 16c, the motor 49 is reversed in rotation so that the chuck pawls are returned. Upon one rotation of the cam shaft, the positioning of the lead frame is accomplished and in response to the signal from the sensor 16d, the cam shaft is stopped and then the bonding step is started.

As described above, upon each rotation of the cam shaft, the intermittent feed device and the positioning device are actuated in synchronism with each other so that one transfer operation or step and one positioning operation or step are accomplished.

Next the mode of overall operation of the lead frame transfer device with the above described construction will be described. As described above, the driving system including the motors and air cylinders is disposed on the side of the guide rail 2. Therefore, when the width of a lead frame is varied, the guide rail 3 is moved toward or away from the guide rail 2 depending upon the width of the lead frame. When a lead frame 1 is fed, it is clamped between the rollers 22 and 25 of the lead frame feed device 20 and transported to the bonding position A. When the leading edge of the lead frame 1 engages with the stopper 51, the sensor 71 is actuated so that the air cylinder 26 is energized and consequently the rollers 25 are spaced apart from the rollers 22. As a result, the lead frame 1 is stopped with its leading edge engaged with the stopper 51.

Under these conditions, the motor 19 is energized. Then the cam group 17 deactivates the positioning device 60 while in response to the signal from the sensor group 16, the air cylinder 43 of the intermittent feed device 40 is energized. As a result, the lead frame 1 is clamped between the stationary pawls 41 and the movable pawls 42. The air cylinder 52 of the stopping device 50 is energized so that the stopper 51 is withdrawn. The motor 49 of the intermittent feed device 40 is energized so that the lead frame 1 is transported by a predetermined stroke. After the lead frame 1 has been moved over a predetermined distance, the cylinder 43 is de-energized so that the lead frame 1 is released. Simultaneously, the cam group 17 actuates the positioning device 60 so that one positioning pin 61 is inserted into the positioning hole of the lead frame 1.

When the lead frame 1 has been moved to and held at a predetermined position or bonding position A, the bonding step is started. During the bonding step, the intermittent feed device 40 is returned to the position shown.

After the bonding step has been accomplished, the motor 19 is energized again so that the positioning pin 61 is lowered. Thereafter the intermittent feed device 40 is activated again so that the next lead frame is moved to and held at the bonding position A and the bonding step is started again.

When the sensor 72 has detected that the trailing edge of the lead frame 1 has passed past the sensor 72 and when the bonding step is finished, the lead frame 1 is discharged by the discharge device 30 to the next working station while the next lead frame 1 is fed by the lead frame feed device 20.

Figure 11:
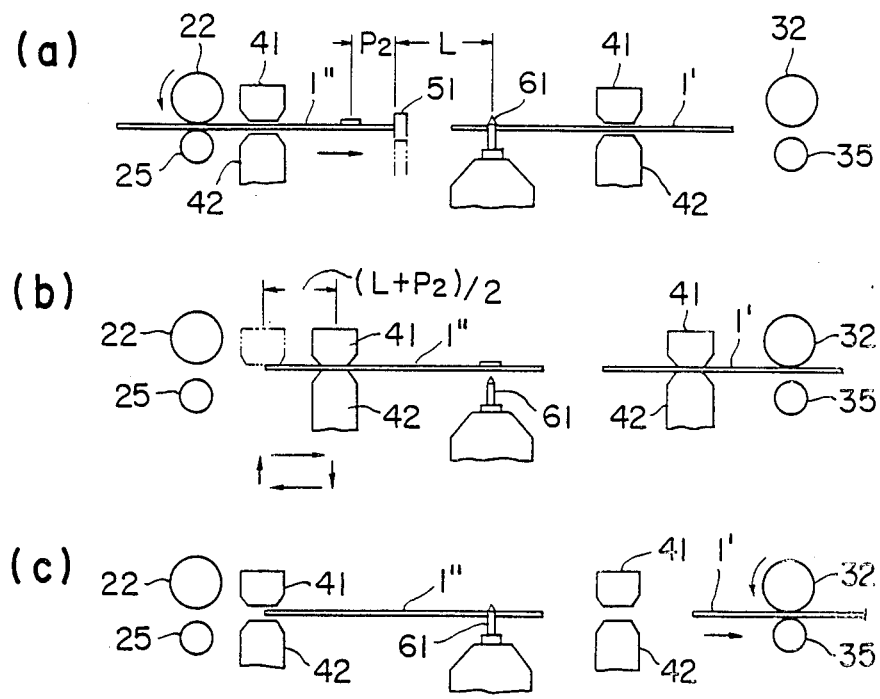
FIGS. 11(a), (b) and (c) are views used to explain the mode of transferring a lead frame by a lead frame transfer device in accordance with the present invention.
Figure 12:
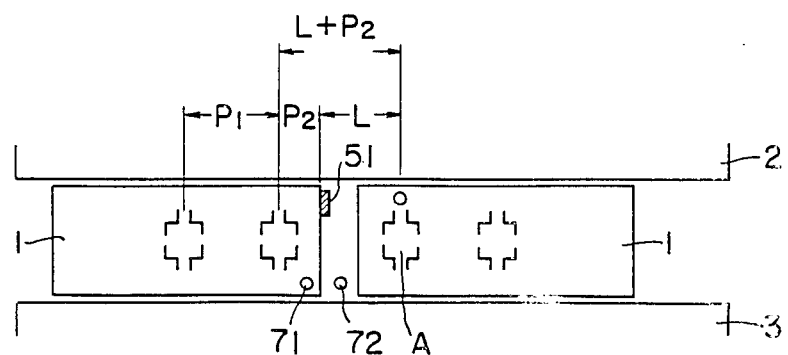
FIG. 12 is a view used to explain a transfer pitch of a lead frame in a lead frame transfer device in accordance with the present invention.

FIGS. 11 and 12 show the relationships among the position of the stopper 51, the bonding position A and the stroke of the intermittent feed device 40. When the pitch of the lead frame is $P_1$, the distance between the leading edge of the lead frame 1 and the point thereon which is first bonded (to be referred to as "the edge distance" in this specification) is $P_2$ and the distance between the stopper 51 and the bonding position A is L (constant), the lead frame 1, which is engaging with the stopper 51, must be displaced by the distance $L+P_2$.

The control unit of the intermittent feed device 40 (not shown) is provided with a numerical input means for entering these values $P_1$, $P_2$ and L. That is, when the size of the lead frames varies, these values are set. Therefore whenever a new lead frame 1 arrives, the intermittent feed device repeats its transfer by $(L+P_2)/2$ twice and then transfers by the stroke of $P_1$. Therefore when the lead frame 1 is clamped and moved, the fast feed is effected.

Thus according to the present invention, in the cases of bonding of lead frames of various sizes, it suffices to adjust the position of the guide rail 3 with respect to the guide rail 2 depending upon the width of a lead frame to be fed and to enter the pitch $P_1$ and the edge distance $P_2$ so that the adjustment time can be remarkably shortened and the transfer and positioning of a lead frame depending on its size can be accomplished in an optimum manner.

According to the present invention, the leading edge of the lead frame 1 is engaged with the stopper 51 at a predetermined position and then transferred by the intermittent feed device which can vary a transfer stroke. As a result, the delicate mechanical adjustment of the "heart portion" of the conventional lead frame feed device can be completely eliminated.

In the above described embodiment, in order to avoid an accumulated error when a lead fram is transmitted intermittently, a turret-like positioning device 60 is used so that the positioning pin 61 is inserted into the corresponding positioning hole of the lead frame, but it is to be understood that when the number of lead frames which are successively fabricated is small, the positioning device 60 may be eliminated. Alternatively, instead of the positioning device, optical position detecting means may be used so as to control the transfer stroke. Therefore even when the frames are successively fabricated in large number, a lead frame transfer device can be provided which can completely eliminate the use of holes and grooves.

So far it has been described that the lead frame which engages with the stopper 51 is transferred twice to the bonding position A, but it is to be understood that if an intermittent feed device capable of feeding a lead frame at various strokes is employed, the lead frame can be moved to the bonding position by one transfer so that the operation efficiency can be further improved. It is of course possible that the guide rail 3 is moved toward or away from the guide rail 2 in response to an external instruction or command.

As described above, according to the present invention, one of a pair of guide rails which support and guide a lead frame is held stationary while the other guide rail is moved toward or away from one guide rail depending upon the width of a lead frame to be handled. Therefore one guide rail and a plurality of driving systems can be mounted in unison. The adjustment is substantially accomplished by moving the other guide rail toward or away from one guide rail depending upon the width of a lead frame to be handled. As a result, for various types of lead frames, the quick and accurate adjustment becomes possible so that the productivity as well as the yield can be remarkably improved.

According to the present invention, in the case of transferring lead frames of various sizes, it becomes possible to transfer and position them without the use of holes or grooves. The delicate adjustments and replacement of various parts which must be accomplished in the case of the conventional lead frame transfer device can be eliminated. Furthermore the quick and accurate adjustment becomes possible so that the productivity as well as the yield can be considerably improved.

What is claimed is:

1. A lead frame transfer device comprising:
   first and second guide rails, said first guide rail being supported by a first stationary supporting plate, and said second guide rail being supported by a second supporting plate movable with respect to said first plate so as to vary a width between said guide rails; and
   a lead frame transferring mechanism for transferring a lead frame along a transfer path, provided on said first guide rail, comprising:
   (a) a lead frame feed device provided at a first end of the transferring path, comprising at least one feed roller for feeding the lead frame into said transferring path, and a drive means for driving said feed roller;
   (b) a lead frame discharge device provided at a second end of said transferring path, comprising at least one discharge roller for discharging the lead frame from the transferring path, and a drive means for driving said discharger roller;
   (c) an intermittent feed device provided along the transferring path between said lead frame feed device and said lead frame discharge device, comprising:
   a chuck mechanism having at least one pair of stationary pawls and at least one pair of movable pawls for clamping therebetween a side edge of the lead frame transmitted from said lead frame feed device; and
   a slide rod for supporting said pawls, and a driving mechanism operatively coupled to said slide rod for driving said chuck mechanism along the transferring path;
   (d) a stopping device having a stopper means adapted to retractably engage a leading edge of a lead frame at a preselected position so as to stop the lead frame along the transferring path, and a means for retracting and engaging said stopper means; and
   (e) a positioning device having a plurality of pins, each of said pins being adapted to engage with different types of lead frames.

2. A device as set forth in claim 1, further comprising:
   means defining gage holes formed in said first and second supporting plates; and
   rail width adjusting means for engaging with said gage holes for varying a width between said first and second guide rails.

3. A device as set forth in claim 2, wherein said rail width adjusting means comprises:
   an abutment means adapted to engage with said gage holes for defining a desired position of said second guide rail, wherein said abutment means is a polygonal column having at least four surfaces of differing lengths, whereby the width between said first and second guide rails can be varied by rotating said abutment means.

4. A device as set forth in claim 1, further comprising:
   an arm connected between said slide rod and said driving mechanism; and
   a threaded movable component operatively connected between said arm and said drive mechanism for moving said arm in response to said driving mechanism.

5. A device as set forth in claim 1, wherein said stopping device comprises a means for stopping said lead frame along a mid point of the transferring path.

6. A device as set forth in claim 1, wherein said positioning device comprises:
   a rotating member disposed below and having an axis of rotation substantially transverse to said transfer path; and
   wherein said pins are mounted at varied axial positions around a periphery of said rotating member.

7. The device as set forth in claim 1, further comprising:
   a first sensor means operatively associated with said chuck mechanism for detecting when said pawls are open and when said pawls are engaged and for moving said pawls in accordance with the detection;
   a second sensor means operatively associated with said lead frame feed device for generating a feed start signal which activates said lead frame feed device.

* * * * *